United States Patent
Hiyama

(10) Patent No.: US 7,863,076 B2
(45) Date of Patent: Jan. 4, 2011

(54) SOLID-STATE IMAGE PICKUP DEVICE, METHOD FOR MAKING SAME, AND IMAGE PICKUP APPARATUS

(75) Inventor: Susumu Hiyama, Kanagawa (JP)

(73) Assignee: Sony Corporation, Tokyo (JP)

(*) Notice: Subject to any disclaimer, the term of this patent is extended or adjusted under 35 U.S.C. 154(b) by 206 days.

(21) Appl. No.: 12/128,102

(22) Filed: May 28, 2008

(65) Prior Publication Data

US 2008/0296640 A1    Dec. 4, 2008

(30) Foreign Application Priority Data

May 29, 2007    (JP) .............................. 2007-141306

(51) Int. Cl.
*H01L 21/00* (2006.01)
(52) U.S. Cl. .................. 438/60; 438/75; 438/144; 257/E27.153; 257/E27.154; 257/E27.159; 257/E27.16; 257/E27.163
(58) Field of Classification Search .............. 438/60, 438/75, 144; 257/E29.234–E29.236, E31.075, 257/E31.078, E31.081, E31.084, E27.153, 257/E27.154, E27.159, E27.16, E27.163
See application file for complete search history.

(56) References Cited

U.S. PATENT DOCUMENTS

| 6,380,005 B1 * | 4/2002 | Nakashiba ................ 438/144 |
| 2006/0192240 A1 * | 8/2006 | Bhattacharyya .......... 257/314 |
| 2007/0210395 A1 * | 9/2007 | Maruyama et al. ........ 257/431 |

FOREIGN PATENT DOCUMENTS

| JP | 10-150184 | 6/1998 |
| JP | 2007258684 | * 4/2007 |

* cited by examiner

*Primary Examiner*—Charles D Garber
*Assistant Examiner*—Yasser A Abdelaziez
(74) *Attorney, Agent, or Firm*—SNR Denton US LLP

(57) ABSTRACT

Disclosed herein is a solid-state image pickup device which includes: a light-receiving unit for photoelectric conversion of incident light; and a charge transfer unit of an n-channel insulating gate type configured to transfer a signal charge photoelectrically converted in the light-receiving unit; wherein the charge transfer unit has an insulating film formed on a transfer electrode and having a negative fixed charge.

11 Claims, 14 Drawing Sheets

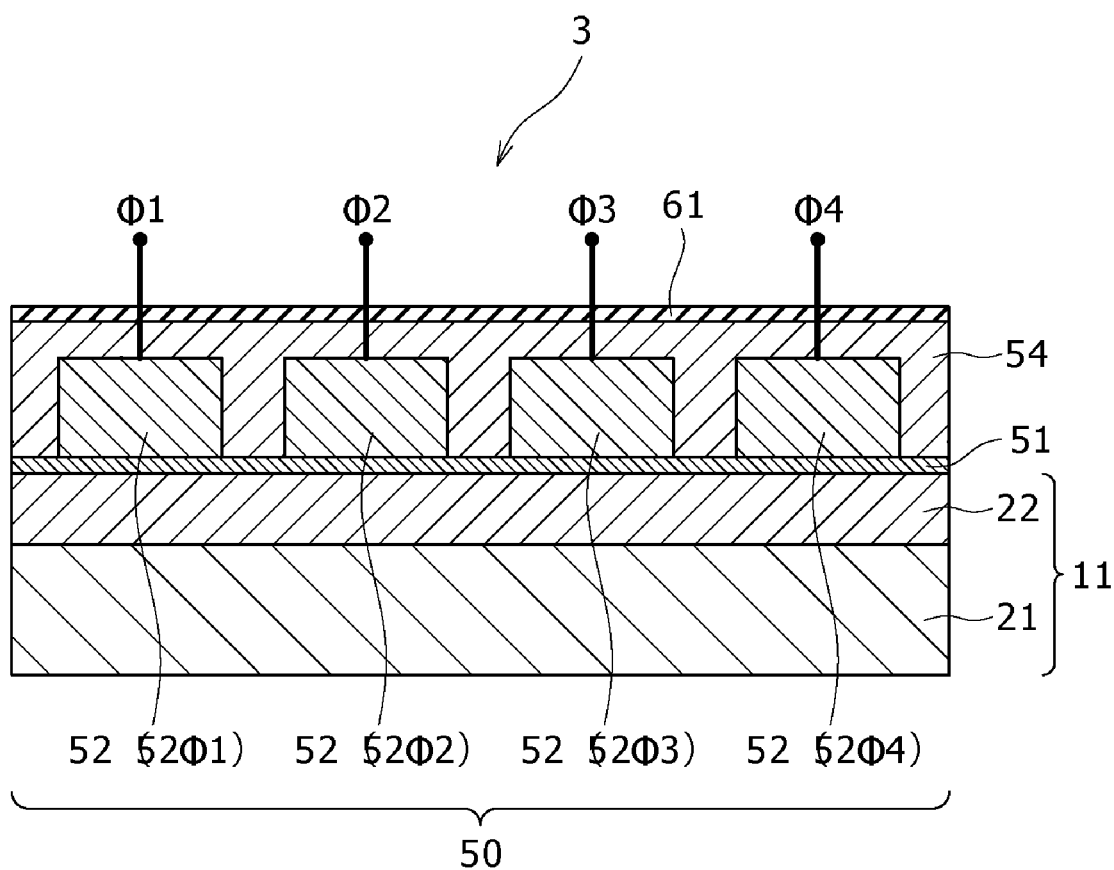

SOLID-STATE IMAGE PICKUP DEVICE, METHOD FOR MAKING SAME, AND IMAGE PICKUP APPARATUS

CROSS REFERENCES TO RELATED APPLICATIONS

The present invention contains subject matter related to Japanese Patent Application JP 2007-141306 filed in the Japan Patent Office on May 29, 2007, the entire contents of which being incorporated herein by reference.

BACKGROUND OF THE INVENTION

1. Field of the Invention

This invention relates to a solid-state image pickup device, a method for making the same, and an image pick apparatus including the solid-state image pickup device.

2. Description of the Related Art

With respect to charge transfer of CCD (charge coupled device), where the charge transfer is carried out, for example, by four-phase drive, high and low binary pulse voltages VH an VL are applied as is particularly shown in FIG. 14. In general, VH used is at 0 V serving as a reference voltage and VL is set at a voltage, which does not permit an unnecessary charge generated at the interface between a silicon substrate and a gate oxide film to be accumulated in a depletion layer beneath a transfer electrode to cause a dark current. This voltage is set at a value lower than a voltage (i.e. pinning voltage, for example, of −9.0 V), at which a hole accumulation layer is formed in the silicon substrate beneath the transfer electrode. Generally, when the pinning voltage is taken as Vp, VL used is at −9.5 V that is lower by about 0.5 V than Vp. The pinning voltage is determined depending on the impurity concentrations of an N-type region and P-type region beneath the transfer electrode and the thickness of the gate insulating film (see, for example, Japanese Patent Laid-Open No. Hei 10-150184).

Next, a vertical charge transfer unit of CCD wherein charge transfer is carried out by four-phase drive is illustrated with reference to FIG. 15 that is a schematic sectional view of the charge transfer unit. As shown in FIG. 15, a vertical charge transfer unit of CCD for carrying out charge transfer by four-phase drive includes, for instance, a semiconductor substrate 111, on which transfer electrodes 152 (φ1), 152 (φ2), 152 (φ3) and 152 (φ4) are repeatedly formed successively through a gate insulating film 151. Moreover, an interlayer insulating film 153 is formed to cover these transfer electrodes 152 therewith. This interlayer insulating film 153 is formed of a silicon oxide film.

With a solid-state image pickup device having such a vertical charge transfer unit as set out above, a region to which a pulse voltage VL is applied is more intensely pinned, thereby reducing a dark current. However, there is a limit in further lowering the value of the pulse voltage VL (or increasing an absolute value). Even if the value of the pulse voltage VL can be made lower so as to keep the pinning state, consumption power increases and is thus disadvantageous for a solid-state image pickup device whose consumption power is ordinarily demanded to be low.

SUMMARY OF THE INVENTION

It is accordingly desirable to provide a solid-state image pickup device which overcomes the above problems involved in related art and permits both dark current and consumption power to be reduced.

It is further desirable to provide a method for making such a pickup device as mentioned above and also to an image pickup apparatus including the pickup device.

According to one embodiment of the invention, there is provided a solid-state image pick device having a light-receiving unit for photoelectric conversion of incident light, and a charge transfer unit of an n-channel insulating gate type transferring a signal charge photoelectrically converted in the light-receiving unit, wherein an insulating film having a negative fixed charge is formed on a transfer electrode of the charge transfer unit.

In this embodiment, a threshold voltage of the charge transfer unit moves in a positive direction (toward an enhancement side) by means of the negative fixed charge of the insulating film, so that a region to which a pulse voltage VL is applied undergoes more intense pinning, thereby reducing a dark current. If a set value of the pulse voltage VL is increased (or an absolute value thereof is made smaller), the pinning state can be maintained, resulting in reduction of consumption power.

According to another embodiment of the invention, there is provided a method for making a solid image pickup device of a type which includes a light-receiving unit for photoelectric conversion of incident light and a charge transfer unit of an n-channel insulating gate type transferring a signal charge photoelectrically converted in the light-receiving unit, the method including the steps of forming the charge transfer unit in a semiconductor substrate and further forming an insulating film having a negative fixed charge on a transfer electrode of the charge transfer unit.

In this embodiment, since the insulating film having a negative fixed charge is formed on the transfer electrode of the charge transfer unit, a threshold voltage of the charge transfer unit moves toward a positive direction (toward an enhancement side) owing to the negative fixed charge of the insulating film. In this condition, the region to which the pulse voltage VL is applied is more intensely pinned, thereby reducing a dark current. If a set value of the pulse voltage VL is increased (or an absolute value thereof is made smaller), the pinning state can be maintained, resulting in reduction of consumption power.

According to a further embodiment of the invention there is provided a solid-state image pickup apparatus including a focusing optical unit focusing an incident light, a solid-state image pickup device having a plurality of sensor units wherein the incident light is photoelectrically converted thereby outputting an electric signal and a focusing lens provided at individual sensor units and focusing the incident light, and a signal processing unit processing the signal photoelectrically converted in the solid-state image pickup device, wherein the solid-state image pickup device includes a light-receiving unit for photoelectric conversion of the incident light and a charge transfer unit of an n-channel insulating gate type wherein a signal charge photoelectrically converted in the light-receiving unit is transferred, the charge transfer unit having a transfer electrode on which an insulating film having a negative fixed charge is formed.

In this embodiment, since the solid-state image pickup device of the invention is employed, there can be obtained a solid-state image pickup apparatus having a reduced dark current and reduced consumption power.

According to the first embodiment of the invention, since the insulating film having a negative fixed charge is formed on individual transfer electrodes, a dark current can be reduced by means of the negative fixed charge, with the attendant advantage that malfunction caused by dark current can be prevented. The threshold voltage of the charge transfer unit can move toward an enhancement side, so that charge transfer becomes possible at a lower gate voltage, enabling low consumption power to be realized.

According to the second embodiment, because of the formation of the insulating film having a negative fixed charge, a dark current can be reduced by means of the negative fixed charge, with the attendant advantage that malfunction caused by dark current can be prevented. The threshold voltage of the charge transfer unit can move toward an enhancement side, so that charge transfer becomes possible at a lower gate voltage, enabling low consumption power to be realized.

According to the third embodiment of the invention, because of the use of the solid-state image pickup device that is able to suppress a dark current, noises in pickup images can be reduced, with the advantage that high-quality images can be recorded.

BRIEF DESCRIPTION OF THE DRAWINGS

FIG. 5 is a schematic sectional view showing a solid-state image pickup device according to a further embodiment (third example) of the invention;

DETAILED DESCRIPTION OF THE PREFERRED EMBODIMENTS

Figure 1:
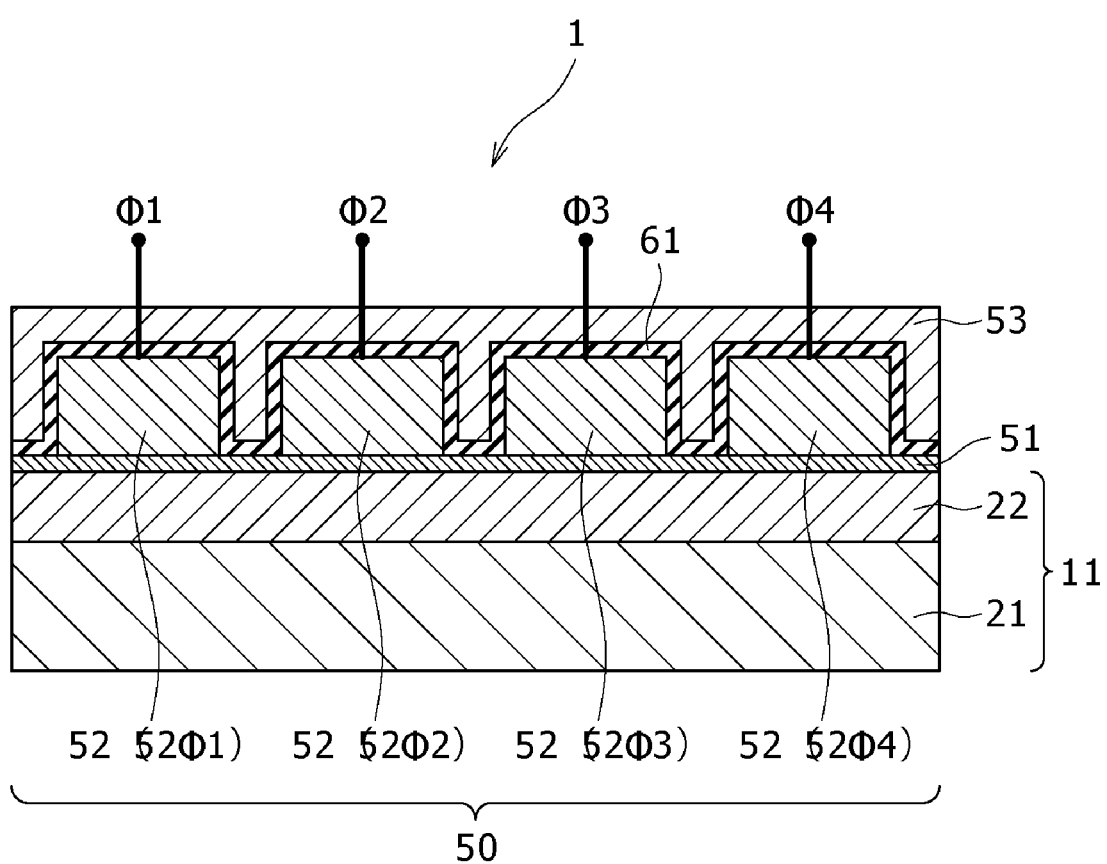
FIG. 1 is a schematic sectional view of a solid-state image pickup device according to one embodiment (first example) of the invention.

A solid-state image pickup device according to one embodiment (first example) of the invention is described with reference to FIG. 1 that is a schematic sectional view of the device. In FIG. 1, a vertical charge transfer unit of the solid-state image pickup device, which is an essential part of the invention, is shown.

As shown in FIG. 1, a p-type well region 21 is formed in a semiconductor substrate 11 and an n-type channel region 22 of a charge transfer unit 50 is formed in the p-type well region 21. Transfer electrodes 52 (52φ1, 52φ2, 52φ3, and 52φ4) are successively formed on the n-type channel region 22 via a gate insulating film 51. Accordingly, this solid-state pickup device 1 becomes a four-phase drive system. An insulating film 61 having a negative fixed charge is formed on the respective transfer electrodes 52 and between adjacent transfer electrodes 52. This insulating film 61 having a negative fixed charge is formed over individual transfer electrodes 52 to cover them therewith. Moreover, another insulating film (hereinafter referred to as interlayer insulating film) is formed on the insulating film 61 having a negative fixed charge. This interlayer insulating film 53 is formed, for example, of a silicon oxide film.

The insulating film 61 having a negative fixed charge may be in thickness sufficient to ensure such a negative fixed charge that a hole accumulation layer is formed in the n-type channel region 22 and is formed in a thickness, for example, of about 3 nm to 20 nm.

The insulating film 61 is made, for example, of hafnium dioxide ($HfO_2$), dialuminium trioxide ($Al_2O_3$), ditantalum pentaoxide ($Ta_2O_5$), dilanthanum trioxide ($La_2O_3$), or diyttrium trioxide ($Y_2O_3$).

Aside from the above oxides, the insulating film 61 may be made of zirconium dioxide ($ZrO_2$), dipraseodymium trioxide ($Pr_2O_3$), dineodium trioxide ($Nd_2O_3$), dipromethium trioxide ($Pm_2O_3$), disamarium trioxide ($Sm_2O_3$), dieuropium trioxide ($Eu_2O_3$), digadolinium trioxide ($Gd_2O_3$), diterbium trioxide ($Tb_2O_3$), didysprosium trioxide ($Dy_2O_3$), diholmium trioxide ($Ho_2O_3$), dierbium trioxide ($Er_2O_3$), dithulium trioxide ($Tm_2O_3$), diytterbium trioxide ($Yb_2O_3$), dilutetium trioxide ($Lu_2O_3$), titanium oxide ($TiO_2$) or the like. In short, the insulating film 61 may be any of insulating films having a negative fixed charge therein.

The insulating film 61 having a negative fixed charge may be incorporated with silicon (Si) or nitrogen (N) in the film in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion in process to be increased.

With the solid-state image pickup device 1, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased (or an absolute value is made smaller), the pinning state can be maintained, thereby causing a threshold value of the charge transfer unit 50 to be moved toward a positive direction (enhancement side). This permits charge transfer to be carried out at a low gate voltage, thereby reducing consumption power. This eventually leads to an advantage in that low consumption power is possible. The insulating film 61 having a negative fixed charge is formed over a light-receiving unit (not shown) of the solid-state image pickup device 1 along with the interlayer insulating film 53, for which the film thicknesses of both insulating film 61 and the interlayer insulating film 53 can be so determined as to be a thickness serving as an anti-reflective film on the light-receiving unit (not shown).

Next, a method for making the solid-state image pickup device according to the embodiment (first example) of the invention is descried with reference the FIGS. 2A to 2E that are, respectively, a schematic sectional view showing a making step. In FIGS. 2A to 2E, an essential part of the invention, i.e. a vertical charge transfer unit of the solid-state image pickup device, is shown. It will be noted that like parts or members as in FIG. 1 are indicated by like reference numerals.

Figure 2A:
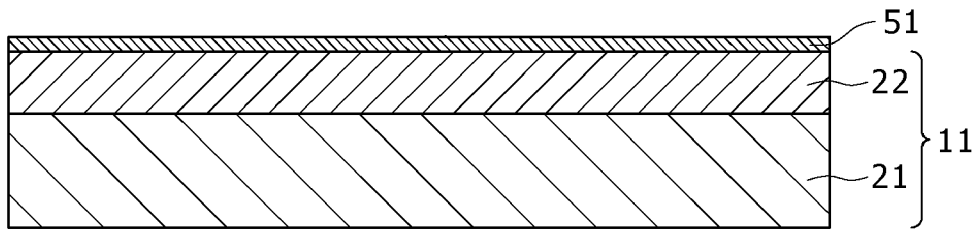
FIGS. 2A to 2E are, respectively, a schematic sectional view showing the step of a method for making such a solid-state image pickup device as in the embodiment (first example) of the invention.

As shown in FIG. 2A, a p-type well region 21 is formed in a semiconductor substrate 11, and an n-type channel region 22 of a charge transfer unit is formed in the p-type well region 21. The semiconductor substrate 11 used is, for example, a silicon substrate. The p-type well region 21 and the n-type channel region 22 are, respectively, formed by ion implantation using, for example, a resist mask (not shown). In such a state that the p-type well region 21 and n-type channel region 22 are formed in the semiconductor substrate 11, a gate insulating film 51 is formed on the semiconductor substrate 11. This gate insulating film 51 is formed, for example, of a silicon oxide film and has a thickness, for example, of 200 nm herein. The gate insulating film 51 can be formed, for example, by a thermal oxidation technique.

Figure 2B:
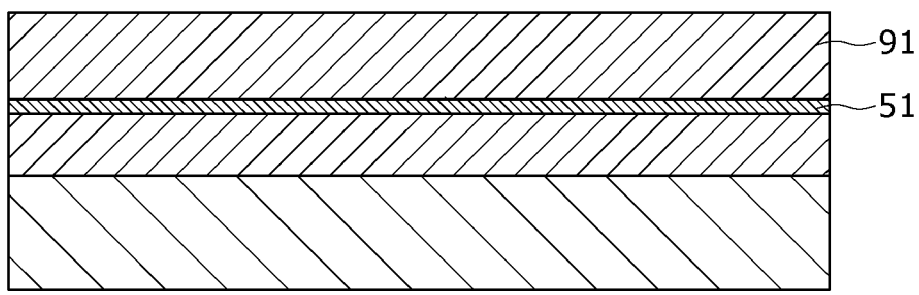

Next, as shown in FIG. 2B, an electrode-forming film 91 used to form a transfer electrode is formed on the gate insulating film 51. This electrode-forming film 91 is formed, for example, of a phosphorus (P) doped amorphous silicon film with a thickness, for example, of 200 nm herein. This film can be formed, for example, by a chemical vapor deposition method.

Figure 2C:
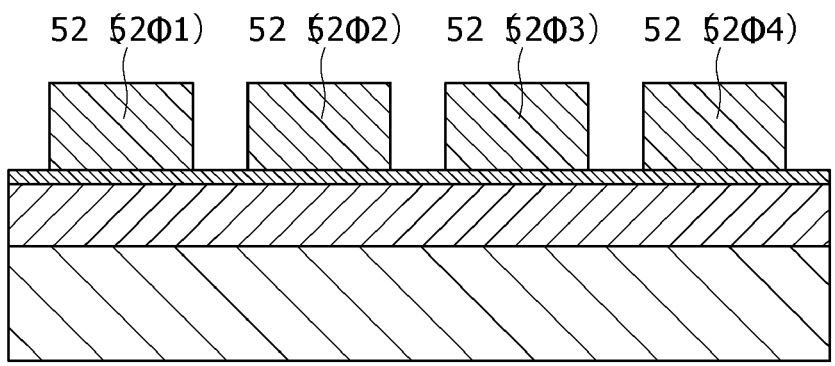

Next, as shown in FIG. 2C, the electrode-forming film 91 (see FIG. 2B) is patterned according to etching using an ordinary resist mask to provide transfer electrodes 52 (52φ1, 52φ2, 52φ3, 52φ4). Thus, this solid-state image pickup device 1 becomes a four-phase drive system.

Figure 2D:
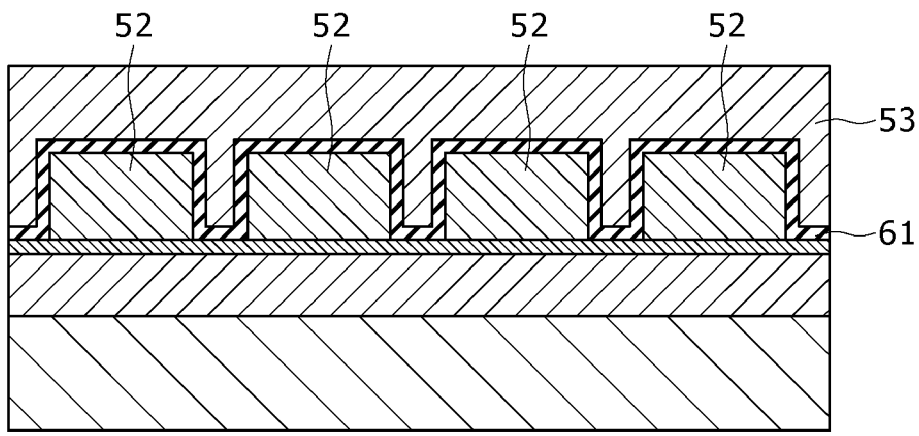

Subsequently, as shown in FIG. 2D, an insulating film 61 having a negative fixed charge is formed on the respective transfer electrodes 52 and between adjacent transfer electrodes 52. This insulating film 61 having a negative fixed electrode is formed as covering individual transfer electrodes 52 therewith and also the gate insulating film 51 located between adjacent transfer electrodes 52.

The insulating film 61 having a negative fixed charge may be in thickness sufficient to provide such a negative fixed charge that a hole accumulation layer is formed in the n-type channel region 22, and is formed in a thickness, for example, of about 3 nm to 100 nm. The film is formed, for example, by an atomic layer deposition (ALD) method or a MOCVD method. A hafnium oxide film with a thickness, for example, of 10 nm is formed by the ALD method herein.

The insulating film 61 is formed, for example, of hafnium dioxide ($HfO_2$), dialuminium trioxide ($Al_2O_3$), ditantalum pentaoxide ($Ta_2O_5$), dilanthanum trioxide ($La_2O_3$), or diyttrium trioxide ($Y_2O_3$).

Aside from the above oxides, the insulating film 61 may be made of zirconium dioxide ($ZrO_2$), dipraseodymium trioxide ($Pr_2O_3$), dineodium trioxide ($Nd_2O_3$), dipromethium trioxide ($Pm_2O_3$), disamarium trioxide ($Sm_2O_3$), dieuropium trioxide ($Eu_2O_3$), digadolinium trioxide ($Gd_2O_3$), diterbium trioxide ($Tb_2O_3$), didysprosium trioxide ($Dy_2O_3$), diholmium trioxide ($Ho_2O_3$), dierbium trioxide ($Er_2O_3$), dithulium trioxide ($Tm_2O_3$), diytterbium trioxide ($Yb_2O_3$), dilutetium trioxide ($Lu_2O_3$), titanium oxide ($TiO_2$) or the like. In short, the insulating film 61 may be any of insulating films having a negative fixed charge therein.

Silicon (Si) or nitrogen (N) may be added to the insulating film 61 in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion in process to be increased.

Next, another insulating film (hereinafter referred to as interlayer insulating film) 53 is formed on the insulating film 61. This interlayer insulating film 53 is formed, for example, of a silicon oxide film. A silicon oxide film is formed herein in a thickness, for example, of 700 nm by a chemical vapor deposition method.

Figure 2E:
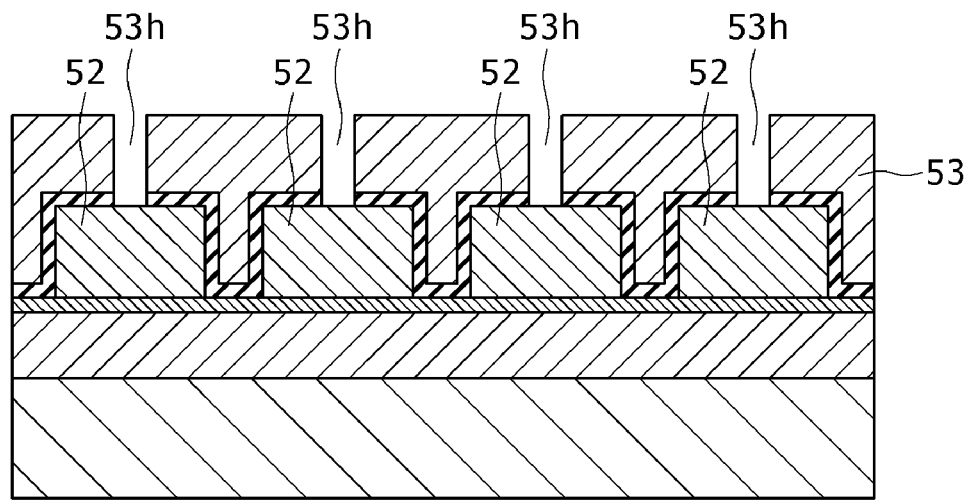

Next, as shown in FIG. 2E, a connection hole 53h arriving at the respective transfer electrodes 52 is made in the interlayer insulating film 53. The connection hole 53h is formed by etching using an ordinary resist mask. Thereafter, although not shown in the figure, a wiring connecting to the respective transfer electrode 52 through the connection hole 53h is formed.

In the method for making the solid-state image pickup device (first example), since the insulating film 61 having a negative fixed charge is formed on the transfer electrodes 52 of the charge transfer unit 50, a potential of the n-type channel region 22 is changed by means of the negative fixed charge in the insulating film 61, so that a region to which a pulse voltage VL is applied is more intensely pinned, thereby reducing a dark current. This is advantageous in that malfunction caused by dark current can be prevented. If a set value of the pulse voltage VL is increased, the pinning state can be maintained and a threshold value of the charge transfer unit 50 is moved toward an enhancement side, under which charge transfer becomes possible at a low gate voltage, thereby permitting consumption power to be reduced. Although the VL value has been, for example, at −9.5 V in existing solid-state image pickup devices, it can be set at −8.5V in the practice of the invention. This is thus advantageous in that low consumption power can be realized.

Figure 3:
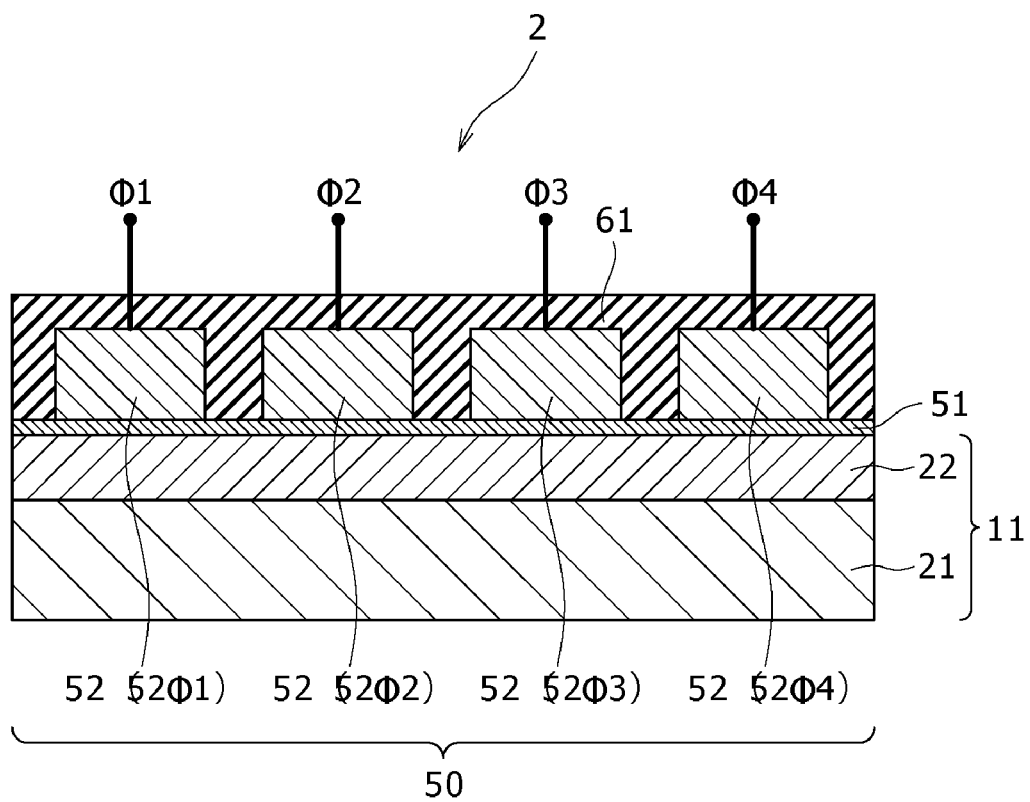
FIG. 3 is a schematic sectional view of a solid-state image pickup device according to another embodiment (second example) of the invention.

A solid-state image pickup device according to another embodiment (second example) of the invention is now described with reference to FIG. 3, which is a schematic sectional view of the device. In FIG. 3, an essential part of the invention, i.e. a vertical charge transfer unit of the solid-state image pickup device, is shown. It will be noted that like parts or members as illustrated with reference to the solid-state image pickup device 1 are indicated by like reference numerals.

As shown in FIG. 3, a p-type well region 21 is formed in a semiconductor substrate 11, and an n-type channel region 22 of a charge transfer unit 50 is formed in the p-type well region 21. Transfer electrodes 52 (52φ1, 52φ2, 52φ3, and 52φ4) are successively formed on the n-type channel region 22 via a gate insulating film 51. Accordingly, this solid-state pickup device 2 becomes a four-phase drive system. An insulating film 61 having a negative fixed charge is formed on the respective transfer electrodes 52 and between adjacent transfer electrodes 52. This insulating film 61 having a negative fixed charge is formed to cover the gate insulating film 51 between the respective transfer electrodes 52 and also bury a space between adjacent transfer electrodes 52.

The insulating film 61 having a negative fixed charge may be in thickness sufficient to ensure such a negative fixed charge that a hole accumulation layer is formed in the n-type channel region 22 and is formed in a thickness, for example, of about 3 nm to 100 nm.

The insulating film 61 having a negative fixed charge is made of such a material as used in the solid-state image pickup derive 1 of the first example.

Silicon (Si) or nitrogen (N) maybe added to the insulating film 61 in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion to be increased.

In the solid-state image pickup device 2, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased (or an absolute value is made smaller), the pinning state can be maintained, thereby causing a threshold value of the charge transfer unit 50 to be moved toward an enhancement side. This permits charge transfer to be carried out at a low gate voltage, thereby reducing consumption power. This eventually leads to an advantage in that low consumption power becomes possible. With the solid-state image pickup device 2, the insulating film 61 is formed so as to bury a space between adjacent transfer electrodes 52, so that a threshold voltage of the charge transfer unit 50 is increased over that of the solid-state image pickup device 1 of the first example. Accordingly, a region to which a pulse voltage VL is applied can be more intensely pinned.

Figure 4A:
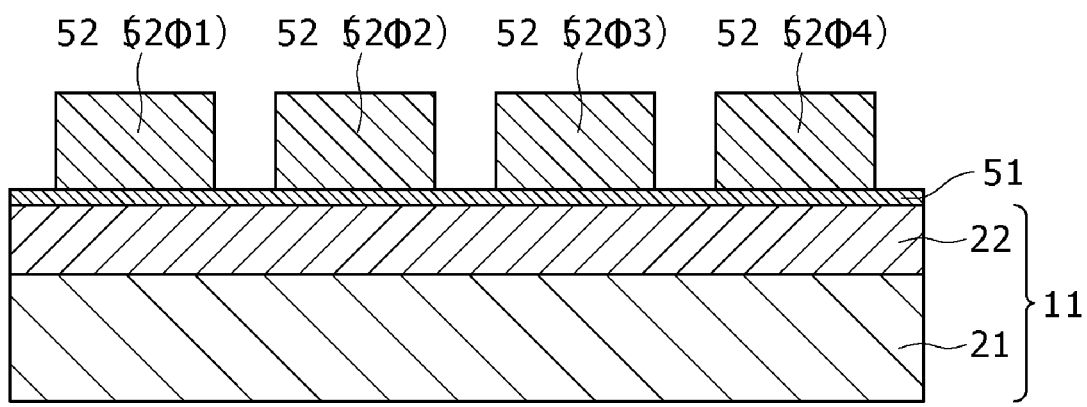
FIGS. 4A and 4B are, respectively, a schematic sectional view showing the step of a method for making such a solid-sate image pickup device as in the another embodiment (second example) of the invention.
Figure 4B:
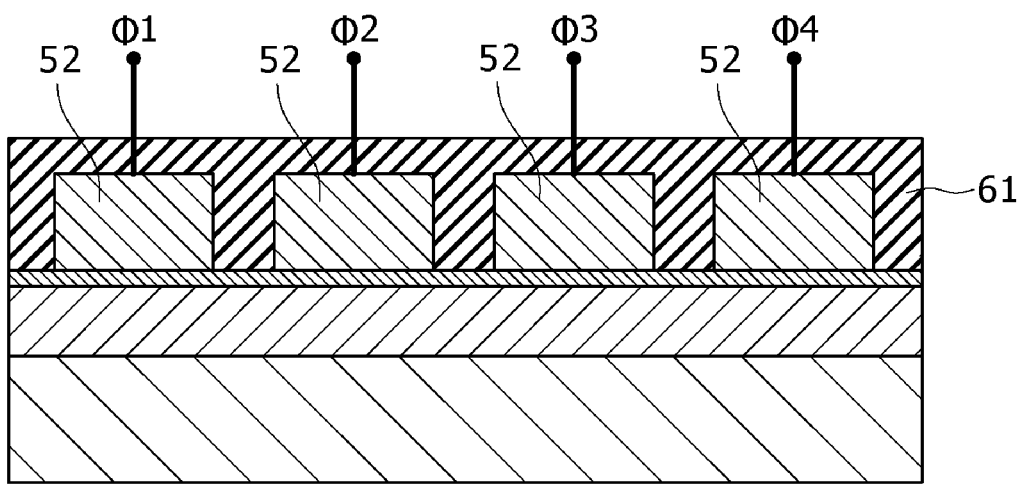

Next, a method for making the solid-state image pickup device according to another embodiment (second example) is described with reference to FIGS. 4A and 4B. In FIGS. 4A and 4B, an essential part of the invention, i.e. a vertical charge transfer unit of a solid-state image pickup device, is shown. It will be noted that like parts or members as of the solid-state image pickup device 1 are indicated by like reference numerals.

As shown in FIG. 4A, in the same way as having illustrated in the first example of the method, a p-type well region 21 is formed in a semiconductor substrate 11, and an n-type channel region 22 of a charge transfer unit is formed in the p-type well region 21. The semiconductor substrate 11 used is, for example, a silicon substrate. The p-type well region 21 and the n-type channel region 22 are, respectively, formed by ion implantation using, for example, a resist mask (not shown). In such a state that the p-type well region 21 and n-type channel region 22 are formed in the semiconductor substrate 11, a gate insulating film 51 is formed over the semiconductor substrate 11. This gate insulating film 51 is formed, for example, of a silicon oxide film with a thickness, for example, of 20 nm. The film formation is carried out, for example, by a thermal oxidation method.

Next, transfer electrodes 52 (52φ1, 52φ2, 52φ3, 52φ4) made, for example, of a phosphorus (P) doped amorphous silicon film are, respectively, formed on the gate insulating film 51. Accordingly, this solid-state image transfer device 2 is a four-phase drive system.

Next, as shown in FIG. 4B, an insulating film 61 having a negative fixed charge is formed on and between the respective transfer electrodes 52. This insulating film 61 is formed as being buried between adjacent transfer electrodes 52.

The insulating film 61 having a negative fixed charge may be in thickness sufficient to ensure a negative fixed charge enabling a hole accumulation layer to be formed in the n-type channel region 22. The insulating film 61 may be made of such a material as used in the solid-state image pickup device 1 of the first example.

Silicon (Si) or nitrogen (N) may be added to the insulating film 61 in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion to be increased.

In the method for making the solid-state image pickup device (second example), since the insulating film 61 having a negative fixed charge is formed on the transfer electrodes 52 of the charge transfer unit 50, a potential of the n-type channel region 22 is changed by means of the negative fixed charge in the insulating film 61, so that a region to which a pulse voltage VL is applied is more intensely pinned, thereby reducing a dark current. This is advantageous in that malfunction caused by dark current can be prevented. If a set value of the pulse voltage VL is increased, the pinning state can be maintained and a threshold value of the charge transfer unit 50 is moved toward an enhancement side, under which charge transfer becomes possible at a low gate voltage, thereby permitting consumption power to be reduced. This eventually leads to an advantage in that low consumption power can be realized. With the method of the second example, the insulating film 61 is formed so as to bury a space between adjacent transfer electrodes, so that a threshold voltage of the charge transfer unit 50 is increased over that of the charge transfer unit 50 of the first example. Accordingly, a region to which a pulse voltage VL is applied can be more intensely pinned.

Next, a solid-state image pickup device according to a further embodiment (third example) of the invention is illustrated with reference to FIG. 5, which is a schematic sectional view of the device. In FIG. 5, a vertical charge transfer unit of a solid-state image pickup device that is an essential part of the invention is shown. It will be noted that parts or members as of the solid-state image pickup device 1 are indicated by like reference numerals.

As shown in FIG. 5, a p-type well region 21 is formed in a semiconductor substrate 11, and an n-type channel region 22 of a charge transfer unit 50 is formed in the p-type well region 21. Transfer electrodes 52 (52φ1, 52φ2, 52φ3, 52φ4) are, respectively, formed on the n-type channel region 22 via a gate insulating film 51. Accordingly, this solid-state image transfer device 3 is a four-phase drive system. Another insulating film (hereinafter referred to as interlayer insulating film) 54 is formed on the respective transfer electrodes 52 and between adjacent transfer electrodes 52. This interlayer insulating film 54 is formed thereon with an insulating film 61 having a negative fixed charge. The interlayer insulating film 54 is formed, for example, of a silicon oxide film.

The insulating film 61 having a negative fixed charge may be in thickness sufficient to ensure such a negative fixed charge that a hole accumulation layer is formed in the n-type channel region 2 and is formed in a thickness, for example, of about 3 nm to 20 nm.

The insulating film 61 having a negative fixed charge maybe made of such a material as used in the solid-state image pickup device 1 of the first example.

Silicon (Si) or nitrogen (N) may be added to the insulating film 61 having a negative fixed charge in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of inhibiting an implanted ion from in the process being increased.

With the solid-state image pickup device 3, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased (or an absolute value is made smaller), the pinning state can be maintained, thereby causing a threshold value of the charge transfer unit 50 to be moved toward an enhancement side. This permits charge transfer to be carried out at a low gate voltage, thereby reducing consumption power. This eventually leads to an advantage in that low consumption power becomes possible. In such an arrangement that the insulating film 61 having a negative fixed charge is formed over a light-receiving unit (not shown) of the solid-state image pickup device 3 along with the interlayer insulating film 54, the thickness of the interlayer insulating film 54 can be so set that the total thicknesses of both insulating film 61 and the interlayer insulating film 54 become a thickness serving an anti-reflective film on the light-receiving unit (not shown). When controlling the thickness of the interlayer insulating film 54, the pinning effect of the insulating film 61 having a negative fixed charge can be controlled. More particularly, in case where the insulating film 61 has a great pinning effect, the interlayer insulating film 54 is made so thick that the insulating film 61 having a negative fixed charge is formed as located distant from the substrate correspondingly. This ensures an appropriate pinning effect.

Figure 6A:
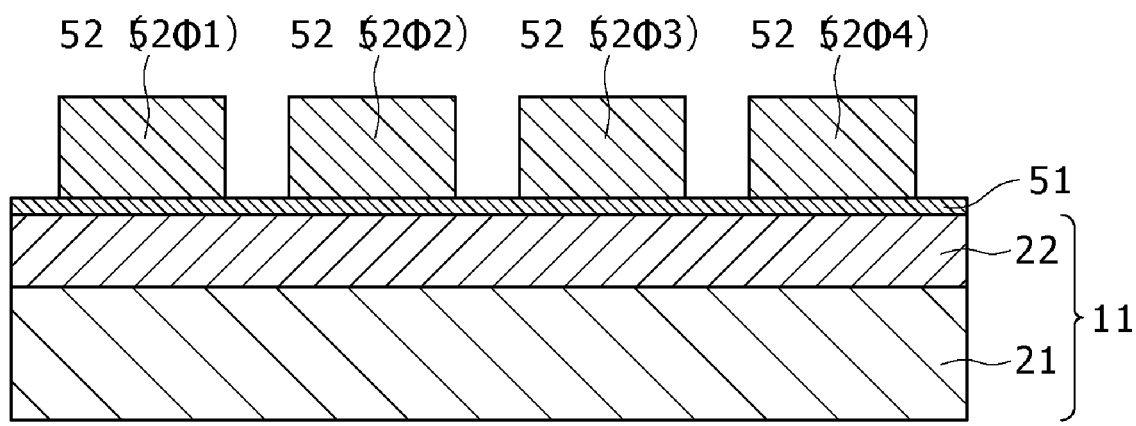
FIGS. 6A and 6B are, respectively, a schematic sectional view showing the step of a method for making a solid-state image pickup device according to the further embodiment (third example) of the invention.
Figure 6B:
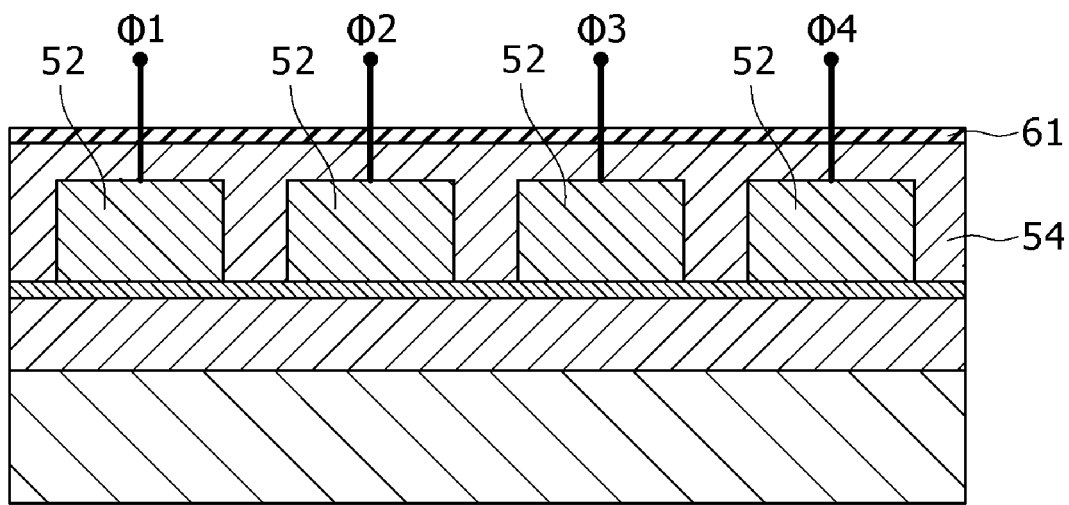

Next, a method for making this solid-state image pickup device according to the further embodiment (third example) is described with reference to FIGS. 6A and 6B, which are a schematic sectional view showing the steps of making the device. In FIGS. 6A and 6B, a vertical charge transfer unit of the solid-state image pickup device, which is an essential part of the invention, is shown. It will be noted that like parts or members as of the solid-state image pickup device are indicated by like reference numerals.

As shown in FIG. 6A, like the first example relating to the making method, a p-type well region 21 is formed in a semiconductor substrate 11, and an n-type channel region 22 of a charge transfer unit is formed on the p-type well region 21. The semiconductor substrate 11 used is, for example, a silicon substrate. The p-type well region 21 and the n-type channel region 22 are formed, for example, by ion implantation using a resist mask (not shown), respectively. In the state where the p-type well region 21 and n-type channel region 22 are formed in the semiconductor substrate 11, a gate insulating film 51 is formed on the semiconductor substrate 11. This gate insulating film 51 is formed, for example, of a silicon oxide film and has a thickness set, for example, at 20 nm herein. The film formation can be effected, for example, by a thermal oxidation method.

Next, transfer electrodes 52 (52φ1, 52φ2, 52φ3, 52φ4) made, for example, of a phosphorous (P) doped amorphous silicon film are, respectively, formed on the gate insulating film 51. Accordingly, the resulting solid-state image pickup device 3 becomes a four-phase drive system.

Next, as shown in FIG. 6B, an interlayer insulating film 54 is formed on the respective transfer electrodes 52 and between adjacent transfer electrodes 52. The interlayer insulating film 54 is formed as being buried between adjacent transfer electrodes 52. Thereafter, an insulating film 61 having a negative fixed charge is formed on the interlayer insulating film 54.

The insulating film 61 may be in thickness sufficient to ensure a negative fixed charge as to form a hole accumulation layer in the n-channel region 22. The insulating film 61 may be made of a material as used in the solid-state image pickup device 1 of the first example.

Silicon (Si) or nitrogen (N) may be added to the insulating film 61 in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of inhibiting an implanted ion in the process from being increased.

In the method for making the solid-state image pickup device (third example), since the insulating film 61 having a negative fixed charge is formed on the transfer electrodes 52 of the charge transfer unit 50, a potential of the n-type channel region 22 is changed by means of the negative fixed charge in the insulating film 61, so that a region to which a pulse voltage VL is applied is more intensely pinned, thereby reducing a dark current. This is advantageous in that malfunction caused by dark current can be prevented. If a set value of the pulse voltage VL is increased, the pinning state can be maintained and a threshold value of the charge transfer unit 50 is moved toward an enhancement side, under which charge transfer becomes possible at a low gate voltage, thereby permitting consumption power to be reduced. This eventually leads to an advantage in that low consumption power can be realized. The insulating film 61 having a negative fixed charge is formed on a light-receiving unit (not shown) of the solid-state image pickup device 3 along with the interlayer insulating film 54, so that the thickness of the interlayer insulating film 54 can be so set that the total thicknesses of the insulating film 61 and the interlayer insulating film 54 become ones serving as an anti-reflective film on the light-receiving unit. Moreover, the control in thickness of the interlayer insulating film 54 enables the pinning effect of the insulating film 61 having a negative fixed charge to be controlled. More particularly, when the pinning effect of the insulating film 61 is great, the interlayer insulating film 54 is made so thick that the insulating film 61 is formed as being located distant from the substrate correspondingly. This ensures an appropriate pinning effect.

Figure 7:
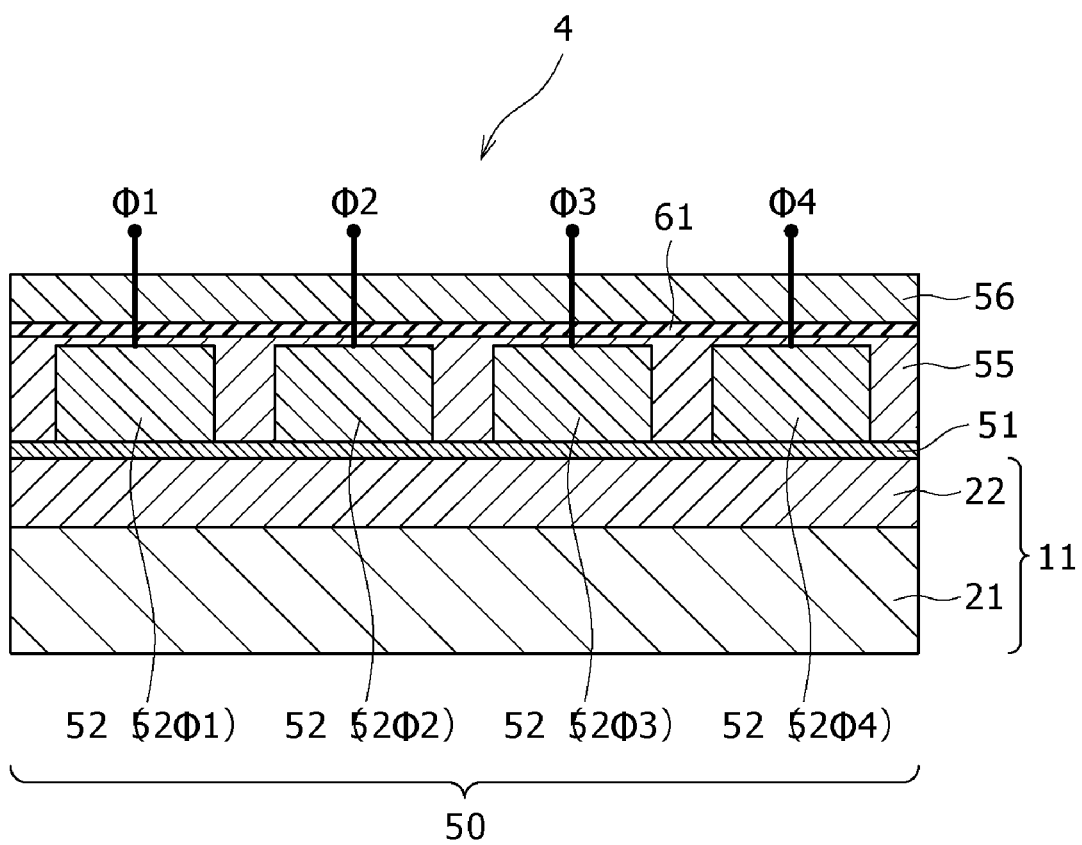
FIG. 7 is a schematic sectional view showing a solid-state image pickup device according to a still further embodiment (fourth example) of the invention.

Next, a solid-state image pickup device according to a still further embodiment (fourth embodiment) of the invention is described with reference to FIG. 7, which is a schematic sectional view of the device. In FIG. 7, a vertical charge transfer unit of the solid-state image pickup device is shown as an essential part of the invention. It will be noted that like parts or members as in the solid-state image pickup device 1 are indicated by like reference numerals.

As shown in FIG. 7, a p-type well region 21 is formed in a semiconductor substrate 11, and an n-type channel region 22 of a charge transfer unit 50 is formed in the p-type well region 21. Transfer electrodes 52 (52φ1, 52φ2, 52φ3, 52φ4) are, respectively, formed on the n-type channel region 22 via a gate insulating film 51. Accordingly, the resulting solid-state image pickup device 4 becomes a four-phase drive system. Another insulating film 55 (hereinafter referred to as a first interlayer insulating film) is formed on the respective transfer electrodes 52 and between adjacent transfer electrodes 52. An insulating film 61 having a negative fixed charge is formed on the first interlayer insulating film 55. This first interlayer insulating film 55 is formed, for example, of a silicon oxide film. A further insulating film (hereinafter referred to as a second interlayer insulating film) 56 is formed on the insulating film 61. This second interlayer insulating film 56 is formed, for example, of a silicon oxide film.

The insulating film 61 may be in thickness sufficient to ensure a negative fixed charge as to form a hole accumulation layer in the n-channel region 22 and is formed in a thickness, for example, of about 3 to 20 nm.

The insulating film 61 may be made of a material as used in the solid-state image pickup device 1 of the first example.

Silicon (Si) or nitrogen (N) may be added to the insulating film 61 in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of inhibiting an implanted ion in the process from being increased.

With the solid-state image pickup device 4, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased, the pinning state can be maintained, thereby causing a threshold value of the charge transfer unit 50 to be moved toward an enhancement side. This permits charge transfer to be carried out at a low gate voltage, thereby reducing consumption power. This eventually leads to an advantage in that low consumption power becomes possible. In such an arrangement that the insulating film 61 having a negative fixed charge is formed over a light-receiving unit (not shown) of the solid-state image pickup device 4 along with the first and second interlayer insulating films 55, 56, the thicknesses of the first and second interlayer insulating films 55, 56 can be so set that the total thicknesses of the insulating film 61 and the first and second interlayer insulating films 55, 56 are ones serving as an anti-reflective film on the light-receiving unit (not shown). When controlling the thickness of the first interlayer insulating films 55, 56, the pinning effect of the insulating film 61 having a negative fixed charge can be controlled. More particularly, in case where the insulating film 61 has a great pinning effect, the first interlayer insulating film 55 is made so thick that the insulating film 61 having a negative fixed charge is formed as located distant from the substrate correspondingly. This ensures an appropriate pinning effect.

Figure 8A:
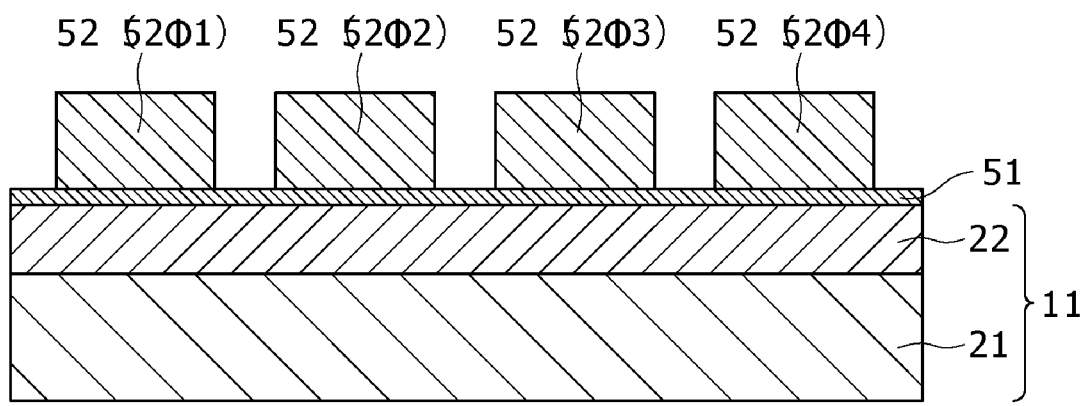
FIGS. 8A and 8B are, respectively, a schematic sectional view showing the step of a method for making a solid-state image pickup device according to the still further embodiment (fourth example) of the invention.
Figure 8B:
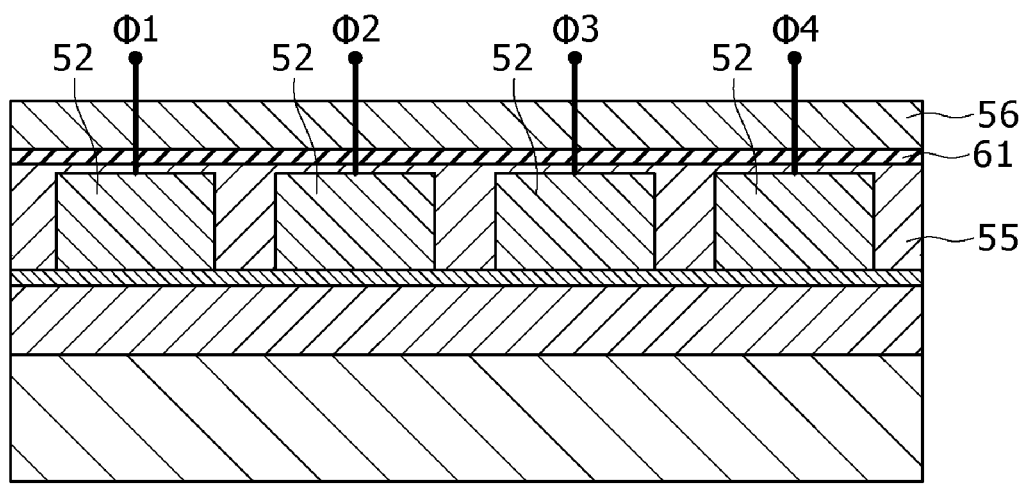

Next, a method for making the solid-state image pickup device according to the further embodiment (fourth example) of the invention is described with reference to FIGS. 8A and 8B, which are, respectively, a schematic sectional view of a making step. In FIGS. 8A and 8B, a vertical charge transfer unit of the solid-state image pickup device is shown as an essential part of the invention. It will be noted that like parts or members as in the solid-state image pickup device 1 are indicated by like reference numerals.

As shown in FIG. 8A, like the first example of the making method, a p-type well region 21 is formed in a semiconductor substrate 11, and an n-type channel region 22 is formed in the p-type well region 21. The semiconductor substrate 11 used is, for example, a silicon substrate. The p-type well region 21 and the n-type channel region 22 are formed, for example, by ion implantation using a resist mask (not shown). In the state where the p-type well region 21 and n-type channel region 22 are formed in the semiconductor substrate 11, a gate insulating film 51 is formed on the semiconductor substrate 11. This gate insulating film 51 is formed, for example, of a silicon oxide film and has a thickness, for example, of 20 nm herein. The film formation can be carried out, for example, by a thermal oxidation method.

Next, transfer electrodes 52 (52ϕ1, 52ϕ2, 52ϕ3, 52ϕ4) made, for example, of a phosphorus (P) doped amorphous silicon film are, respectively, formed on the gate insulating film 51. Accordingly, this solid-state image transfer device 4 becomes a four-phase drive system.

Next, as shown in FIG. 8B, a first layer insulating film 55 is formed on the respective transfer electrodes 52 and between adjacent transfer electrodes 52. This insulating film 55 is formed as being buried between adjacent transfer electrodes 52. An insulating film 61 having a negative fixed charge is formed on the first interlayer insulating film 55.

The insulating film 61 having a negative fixed charge may be in thickness sufficient to ensure a negative fixed charge enabling a hole accumulation layer to be formed in the n-type channel region 22. The insulating film 61 may be made of such a material as used in the solid-state image pickup device 1 of the first example.

The insulating film 61 may be incorporated with silicon (Si) or nitrogen (N) in the film in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion to be increased.

Next, a second interlayer insulating film 56 is formed on the insulating film 61 having a negative fixed charge. This second interlayer insulating film 56 is formed, for example, of a silicon oxide film.

In the method for making the solid-state image pickup device (fourth example), since the insulating film 61 having a negative fixed charge is formed on the transfer electrodes 52 of the charge transfer unit 50, a potential of the n-type channel region 22 is changed by means of the negative fixed charge in the insulating film 61, so that a region to which a pulse voltage VL is applied is more intensely pinned, thereby reducing a dark current. This is advantageous in that malfunction caused by dark current can be prevented. If a set value of the pulse voltage VL is increased, the pinning state can be maintained and a threshold value of the charge transfer unit 50 is moved toward an enhancement side, under which charge transfer becomes possible at a low gate voltage, thereby permitting consumption power to be reduced. This eventually leads to an advantage in that low consumption power can be realized. Since the insulating film 61 is formed on a light-receiving unit (not shown) of the solid-state image pickup device 4 along with the first and second interlayer insulating films 55, 56, the thicknesses of the first and second interlayer insulating films 55, 56 can be so set that the total thicknesses of the insulating film 61 and the first and second interlayer insulating films 55, 56 become ones serving as an anti-reflective film on the light-receiving unit. When the thickness of the first interlayer insulating film 55 is controlled, the pinning effect of the insulating film 61 having a negative fixed charge can be controlled. More particularly, where the pinning effect of the insulating film 61 is great, the thickness of the first interlayer insulating film 55 is made so great that the insulating film 61 having a negative fixed charge is formed as located distant from the substrate correspondingly. This ensures an appropriate pinning effect.

In the first to fourth examples, the transfer electrodes are formed as a single-layered electrode material film. In some solid-state image pickup devices, a plurality of electrode-forming films may be formed as a transfer electrode. For an instance where a transfer electrode is formed of a double-layered electrode film, a fifth example is illustrated with reference to FIG. 9 that is a schematic sectional view of a vertical charge transfer unit of a solid-state image pickup device and a sixth example is illustrated with reference to FIG. 10, which is likewise a schematic sectional view of a vertical charge transfer unit.

Figure 9:
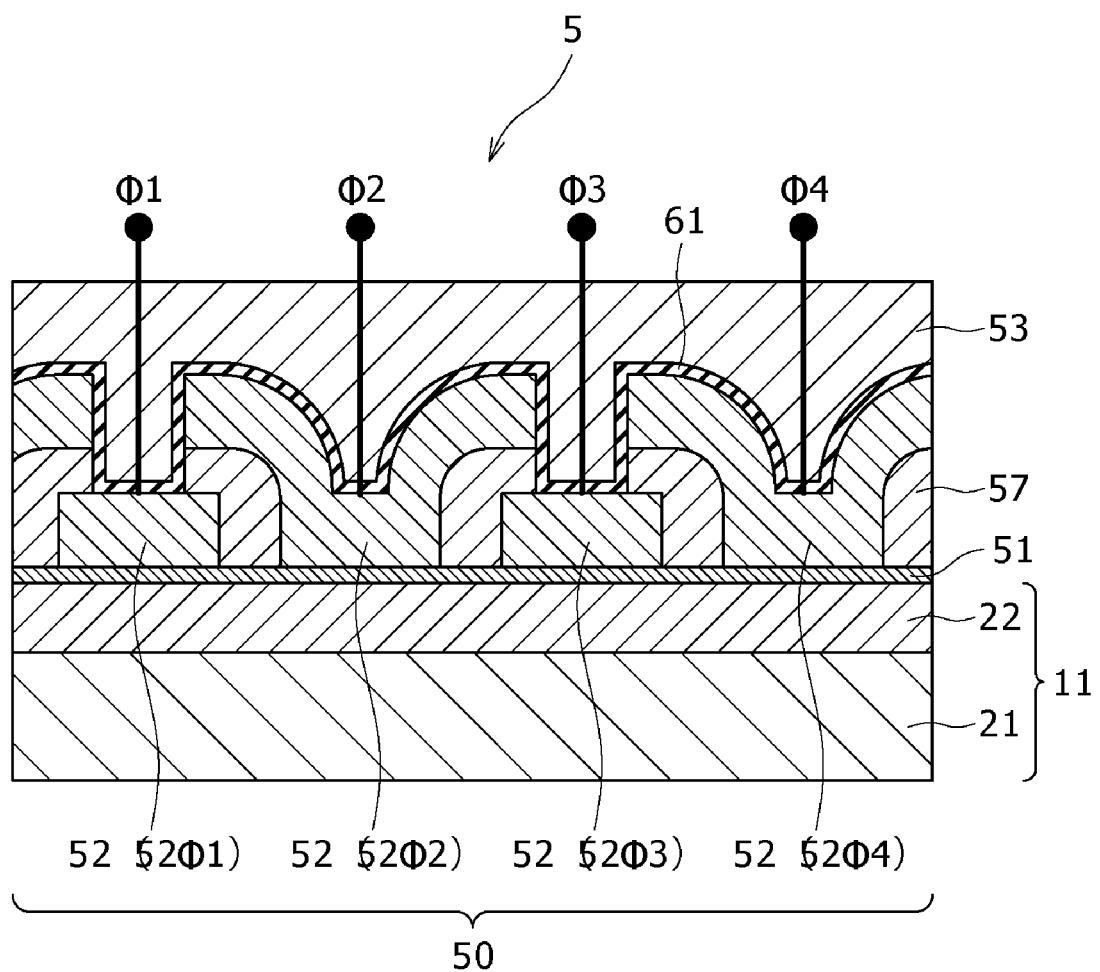
FIG. 9 is a schematic sectional view showing a solid-state image pickup device according to another embodiment (fifth example) of the invention.

As shown in FIG. 9, p-type well region 21 is formed in a semiconductor substrate 11, and an n-type channel region 22 of a charge transfer unit 50 is formed in the p-type well region 21. A gate insulating film 51 is formed on the n-type channel region 22. Transfer electrodes 52 (52φ1, 52φ3), each formed of a first-layered electrode-forming film, are formed on the gate insulating film 51. A first insulating film 57 is formed to cover the transfer electrodes 52 (52φ1, 52φ3) therewith. Transfer electrodes 52 (52φ2, 52φ4), each formed of a second-layered electrode-forming film, are formed between the transfer electrodes 52φ1, 52φ3 and in a state of being overlapped on part of the transfer electrodes 52φ1, 52φ3 via the first insulating film 57. Thus, the solid-state image pickup device 5 becomes a four-phase drive system. The first insulating film 57 is formed, for example, of a silicon oxide film.

The transfer electrodes 52φ1, 52φ3, each provided between the transfer electrodes 52φ2, 52φ4, are exposed, under which an insulating film 61 having a negative fixed charge is formed to cover the respective transfer electrodes 52. Moreover, another insulating film (hereinafter referred to as interlayer insulating film) 53 is formed on the insulating film 61. This interlayer insulating film 53 is formed, for example, of a silicon oxide film.

The insulating film 61 having a negative fixed charge may be in thickness sufficient to ensure a negative fixed charge enabling a hole accumulation layer to be formed in the n-type channel region 22 and is formed in a thickness, for example, of about 3 nm to 20 nm.

The insulating film 61 may be made of a material as used in the solid-state image pickup device 1 of the first example.

The insulating film 61 may be incorporated with silicon (Si) or nitrogen (N) in the film in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion to be increased.

With the solid-state image pickup device 5, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased (or an absolute value is made smaller), the pinning state can be maintained, thereby causing a threshold value of the charge transfer unit 50 to be moved toward an enhancement side. This permits charge transfer to be carried out at a low gate voltage, thereby reducing consumption power. This eventually leads to an advantage in that low consumption power becomes possible. In this way, the solid-state image pickup device 6 is able to achieve similar effects as the solid-state image pickup device 1.

Figure 10:
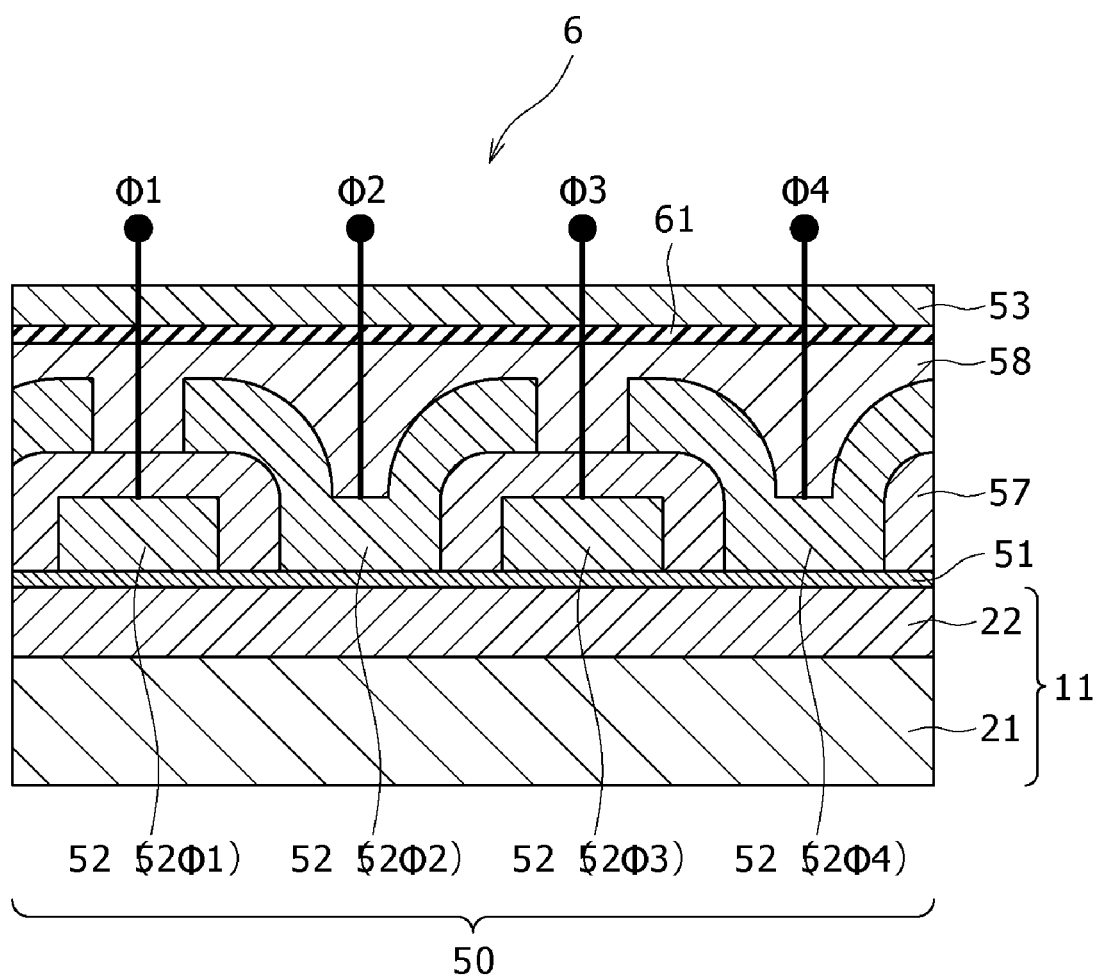
FIG. 10 is a schematic sectional view showing a solid-state image pickup device according to still another embodiment (sixth example) of the invention.

As shown in FIG. 10, a p-type well region 21 is formed in a semiconductor substrate 11, and an n-type channel region 22 of a charge transfer unit 50 is formed in the p-type well region 21. A gate insulating film 51 is formed on the n-type channel region 22. Transfer electrodes 52 (52φ1, 52φ3), each formed of a first-layered electrode-forming film, are formed on the gate insulating film 51. A first insulating film 57 is formed to cover the transfer electrodes 52 (52φ1, 52φ3) therewith. Transfer electrodes 52 (52φ2, 52φ4), each formed of a second-layered electrode-forming film, are formed between the transfer electrodes 52φ1, 52φ3 and in a state of being overlapped on part of the transfer electrodes 52φ1, 52φ3 via the first insulating film 57. Thus, the solid-state image pickup device 6 becomes a four-phase drive system. A second insulating film 58 is formed to cover the transfer electrodes 52φ2, 52φ4. The first and second insulating films 57, 58 are formed, for example, of a silicon oxide film, respectively.

An insulating film 61 having a negative fixed charge is formed on the second insulating film 58. Another insulating film (hereinafter referred to as interlayer insulating film) 53 is formed on the insulating film 61 having a negative fixed charge. This interlayer insulating film 53 is formed, for example, of a silicon oxide film.

The insulating film 61 may be in thickness sufficient to ensure a negative fixed chare enabling a hole accumulation layer to be formed in the n-type channel region 22 and is formed in a thickness, for example, of about 3 nm to 30 nm.

The insulating film 61 may be formed of a material as used in the solid-state image pickup device 1 of the first example.

The insulating film 61 may be incorporated with silicon (Si) or nitrogen (N) in the film in amounts not impeding insulating properties thereof. The concentration of silicon (Si) or nitrogen (N) is appropriately determined within a range not impeding the insulating properties of the film as just mentioned above. The addition of silicon (Si) or nitrogen (N) in the film enables the heat resistance of film and the capability of blocking an implanted ion to be increased.

With the solid-state image pickup device 6, because a potential of the n-type channel region 22 is changed by means of the negative fixed change in the insulating film 61, a region to which a pulse voltage VL is applied is more intensely pinned, thereby reducing a dark current. This is advantageous in that malfunction caused by dark current can be prevented. If a set value of the pulse voltage VL is increased (or an absolute value is made smaller), the pinning state can be maintained, thereby causing a threshold value of the charge transfer unit 50 to be moved toward an enhancement side. This permits charge transfer to be carried out at a low gate voltage, thereby reducing consumption power. This eventually leads to an advantage in that low consumption power is possible. In this way, the solid-state image pickup device 6 ensures similar effects as the solid-state image pickup device 1. When the thicknesses of the second insulating film 58, insulating film 61 having a negative fixed charge and interlayer insulating film 53 and the like are appropriately set, similar effects as of the solid-state image pickup device 4 can be obtained.

In the foregoing examples, the film formation of the insulating film 61 having a negative fixed charge maybe carried out by any of methods including an ALD method, a MOCVD method and the like. The silicon oxide film forming the respective insulating films may be formed, for example, by a thermal CVD method, a plasma CVD method of the like. As the laminated film structure including the insulating film 61, there are mentioned a laminate film, shown in FIG. 1, of the insulating film 61 having a negative fixed charge and the silicon oxide film as viewed from a lower layer, a laminate film, shown in FIG. 5, of the silicon oxide film and the insulating film 61 having a negative fixed charge as viewed from a lower layer, and a laminate film, shown in FIG. 7, of the silicon oxide film, the insulating film 61 having a negative fixed charge and the silicon oxide film as viewed from a lower layer. Of these, the laminate film that gives the greatest influence on the potential of the n-type channel region 22 (semiconductor substrate 11) is the laminate film shown in FIG. 1 wherein the insulating film 61 having a negative fixed charge is located close to the semiconductor substrate 11. In case where the influence on the semiconductor substrate 11 is too great, the laminate film structures of FIGS. 5 and 7 are adopted.

With the solid-state image pickup devices 1 to 6, the pinning voltage can be controlled without changing impurity concentration in the semiconductor substrate 11, i.e. an impurity concentration in the n-type channel region 22, and the thickness of the gate insulating film 51. Furthermore, the pinning voltage can be controlled by changing the thickness of the insulating film 61 having a negative fixed charge because the larger the thickness of the insulating film 61 having the negative fixed charge is, the larger the negative fixed charge becomes.

Next, an instance of a solid-state image pickup device, to which the first to fourth examples are applicable, is illustrated with reference to FIG. 11, which is a schematic sectional view of the device structure. In the figure, the solid-state image pickup device 1 is shown as a typical one.

Figure 11:
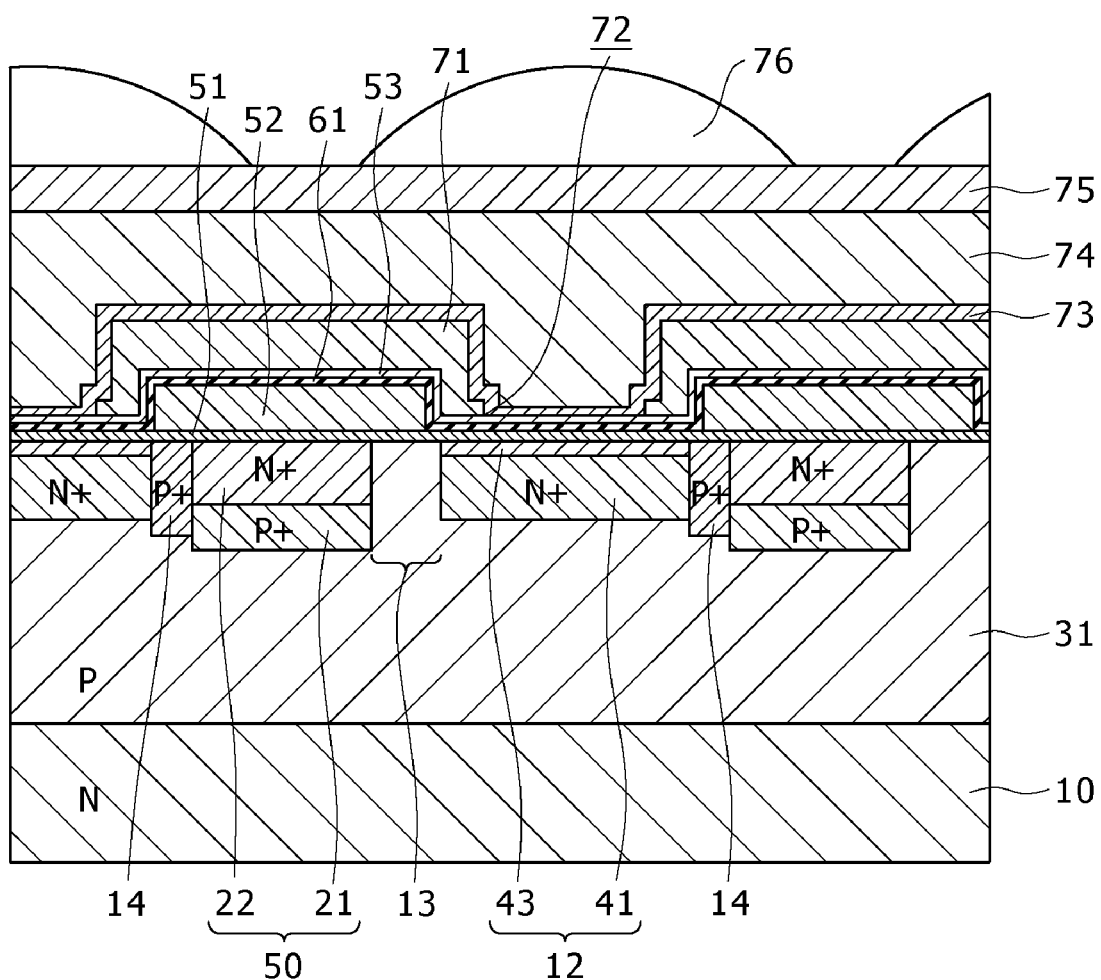
FIG. 11 is a schematic sectional view showing a solid-state image pickup apparatus to which the devices of first to fourth examples are applicable.

As shown in FIG. 11, a p-type well region 31 is formed in a semiconductor substrate 11 (e.g. an N-type silicon substrate), and a light-receiving unit 12 is formed in the p-type well region 31. A read gate unit 13, a vertical charge transfer unit 50 and a channel stop region 14 are formed at one side of the light-receiving unit 12, and an adjacent light-receiving unit 12 is further formed. A channel stop region 14 is formed at the other side of the light-receiving unit 12.

The light-receiving unit 12 is formed of an n-type impurity region 41 and a p-type hole accumulation region 43 formed on top of the region 41.

The vertical charge transfer unit 50 is constituted of a p-type well region 21 that is higher in concentration than the p-type well region 31 and an n-type channel region 22. A transfer electrode 52 is formed on the n-type channel region 22 through a gate insulating film 51. This electrode 52 serves also as a read gate electrode along with the vertical transfer electrode.

An insulating film 61 having a negative fixed charge and an interlayer insulating film 53 are successively formed to cover the electrode 52 therewith, followed by further formation of a light-shielding film 71. The light-shielding film 71 is formed of a film of a metal such as tungsten and aluminium. This light-shield film 71 is formed with an opening 72 over the light-receiving unit 12, which is further covered with a passivation film 73 and a flattening film 74. A color filter layer 75 is formed on the flattening film 74. In order to allow incident light to be efficiently focused on the light-receiving unit 12, a focusing lens 76 is provided on the color filter 75.

The arrangement of the laminate film including the insulating film 61 having a negative fixed charge of the solid-state image pickup devices 1 to 4 of the invention can be applied to a solid-state image pickup device as is particularly illustrated with reference to FIG. 11.

Next, the effects of the insulating film 61 having a negative fixed charge illustrated in the respective examples are particularly described with reference to FIG. 12.

Figure 12:
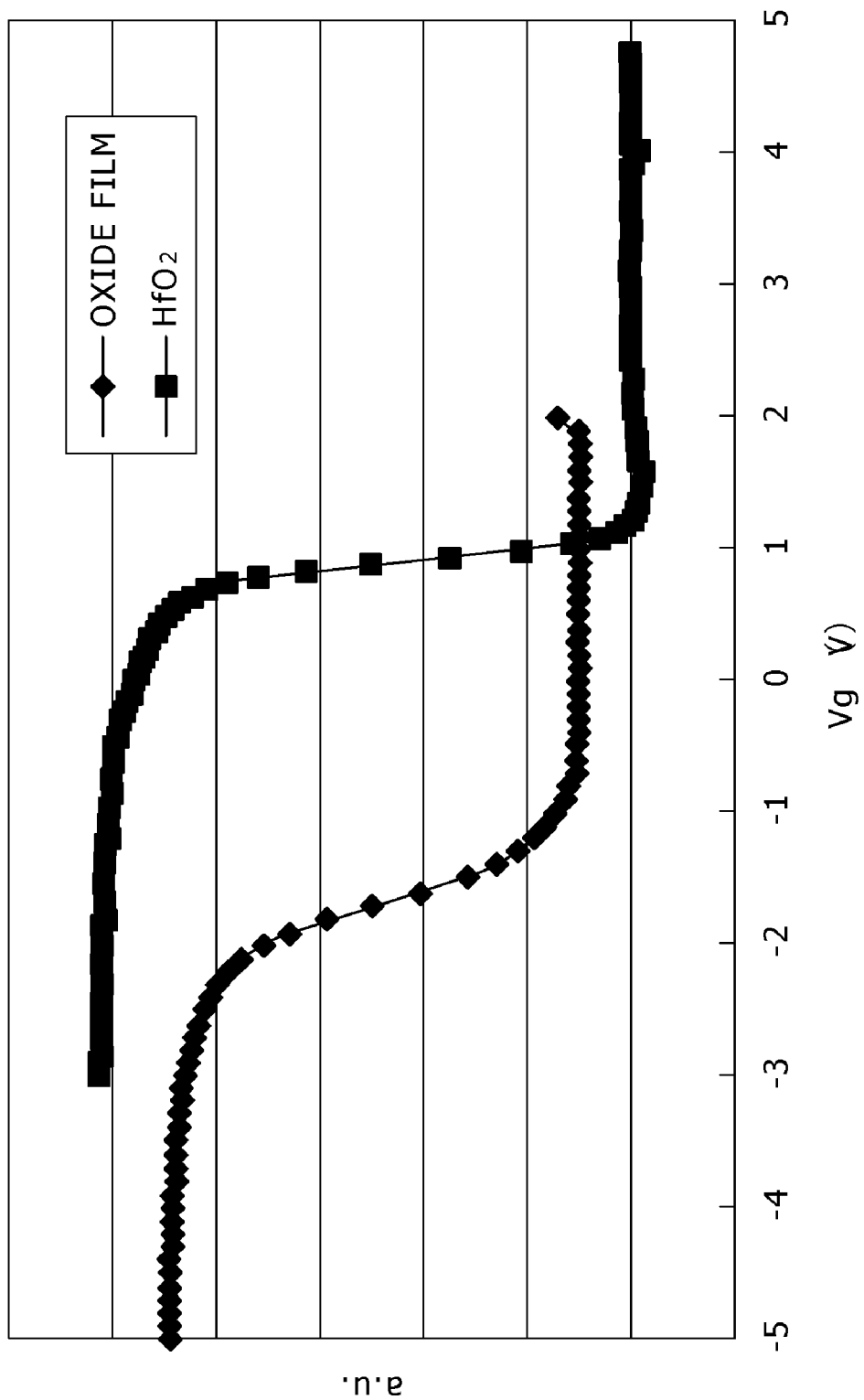
FIG. 12 is a graph showing the effect of an insulating film having a negative fixed charge.

As shown in FIG. 12, it will be seen that the formation of the insulating film 61 having a negative fixed charge permits a flat band voltage to be moved toward a positive (+) side. More particularly, the threshold voltage moves toward an enhancement side. This means a negative fixed charge existing in the insulating film 61.

Figure 13:
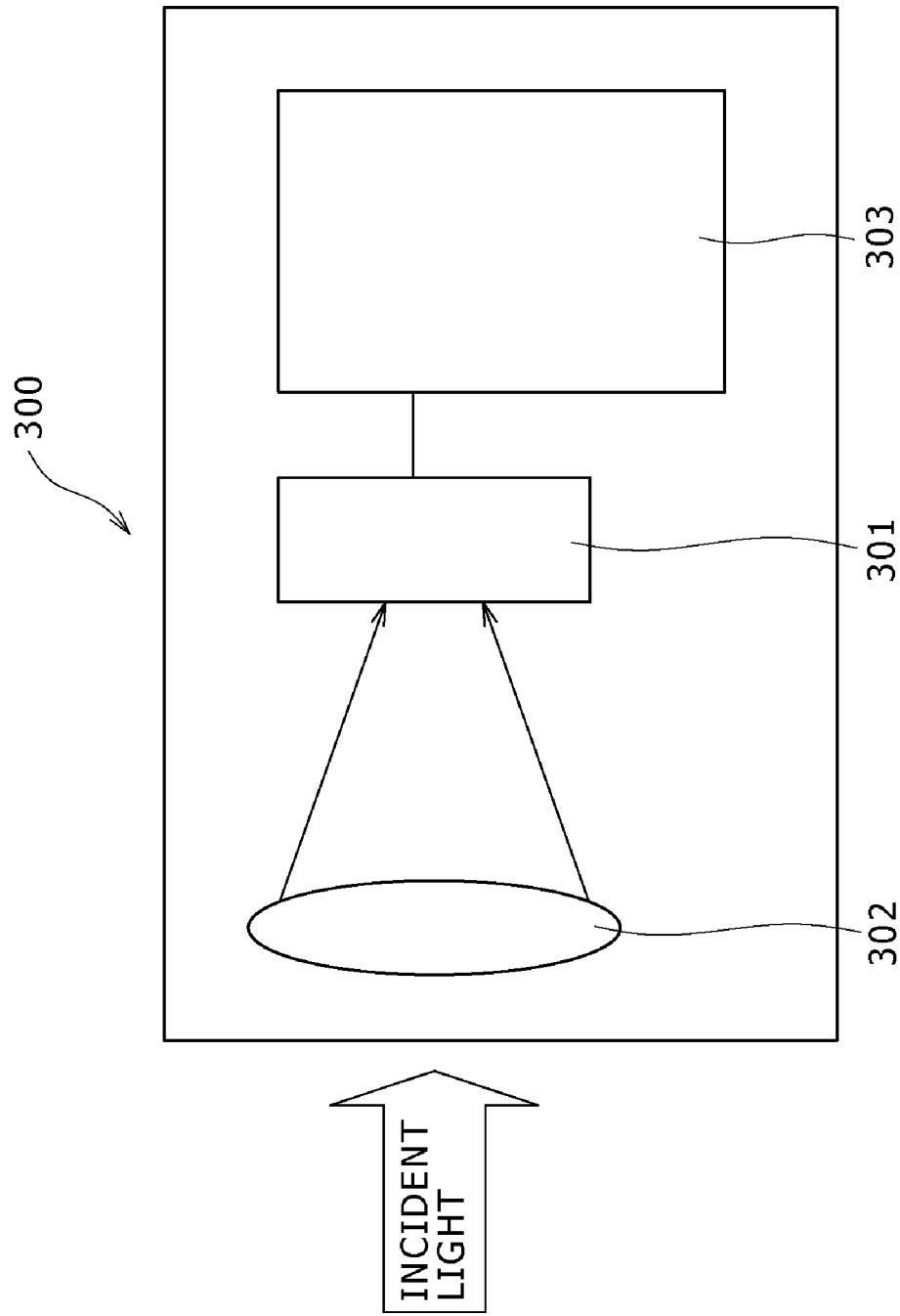
FIG. 13 is a block diagram showing an image pickup apparatus (example) according to an embodiment of the invention.
Figure 14:
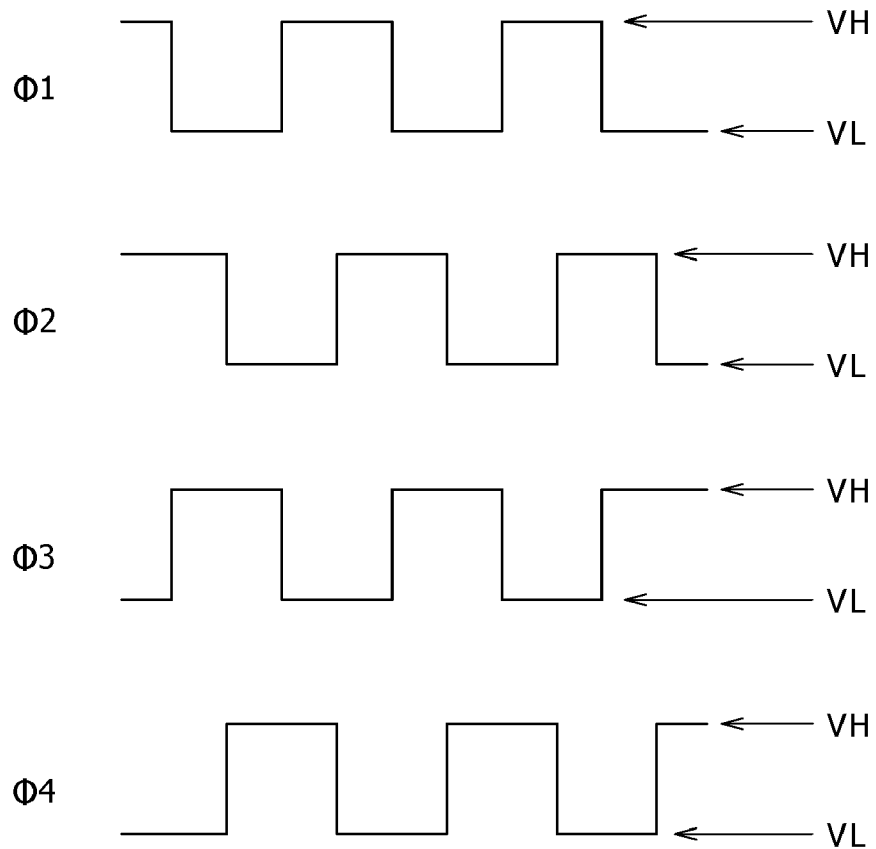
FIG. 14 is a timing chart showing charge transfer of CCD.
Figure 15:
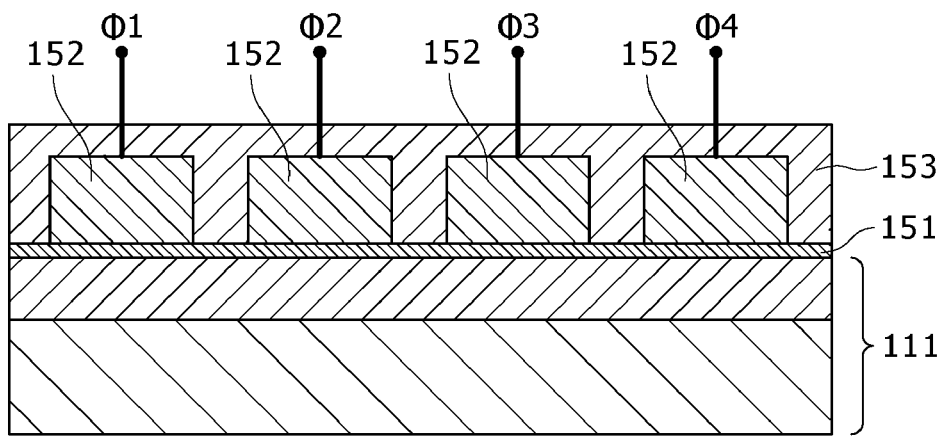
FIG. 15 is a schematic sectional view showing a vertical charge transfer unit of CCD wherein charge transfer is carried out by four-phase drive.

An image pickup apparatus according to an embodiment (example) of the invention is described based on a block diagram of FIG. 13. This image pickup apparatus includes a video camera, a digital still camera and a camera of cell phones.

As shown in FIG. 13, an image pickup apparatus 300 includes a solid-state pickup device (not shown) in an image pickup unit 301. This image pickup unit 301 is provided with a focusing optical system 302 focusing an image at a focusing side thereof. The image pickup unit 301 is connected with a signal processor 303 having a drive circuit driving the unit 301 and a signal processing circuit processing a signal photoelectrically converted in the solid-state image pickup device into an image. The image signal processed in the signal processing unit 303 can be memorized in an image memory (not shown). In such an image pickup apparatus 300, the solid-state image pickup device may be any of the solid-state image pickup devices 1 to 6 illustrated in the foregoing embodiments.

With the image pickup apparatus of the invention, since any of the solid-state image pickup devices 1 to 6 wherein a dark current can be suppressed is used, noises in a pickup image can be reduced, with the attendant advantage that an image of high quality can be recorded.

It will be noted that the image pickup apparatus 300 of the invention is not limited to one illustrated above, but may be applied to any arrangement provided that the solid-state image pickup device of the invention is used therein.

The solid-state image pickup device 1 to 6 may be formed as one chip or may be in the form of a module having an image pickup function wherein an image pickup device and a signal processor or an optical system are packaged as a whole. The invention is applicable to an image pickup apparatus as well as to a solid-state image pickup device. In the latter case, a high-quality imaging effect as the pickup apparatus can be obtained. The image pickup apparatus means, for example, portable apparatus having a camera or image pickup function. The term "image pickup" covers fingerprint detection in a broad sense as well as picking up of an image in ordinary camera photography.

It should be understood by those skilled in the art that various modifications, combinations, sub-combinations and alterations may occur depending on design requirements and other factor in so far as they are within the scope of the appended claims or the equivalents thereof.

What is claimed is:

1. A solid-state image pickup device which comprises:
    a light-receiving unit for photoelectric conversion of incident light; and
    a charge transfer unit of an n-channel insulating gate type configured to transfer a signal charge photoelectrically converted in the light-receiving unit;
    wherein
        said charge transfer unit has an insulating film formed on a transfer electrode,
        said insulating film has a negative fixed charge, and
        said insulating film is in contact between adjacent transfer electrodes with an insulating layer of a substrate.

2. The solid-state image pickup device according to claim 1, wherein said insulating film is formed on said transfer electrode and extends continuously between the adjacent transfer electrodes.

3. The solid-state image pickup device according to claim 1, wherein said insulating film is formed on said transfer electrode and is buried between the adjacent transfer electrodes.

4. The solid-state image pickup device according to claim 1, wherein said insulating film is formed on another insulating film formed on said transfer electrode.

5. A solid-state image pickup device which comprises:
a light-receiving unit for photoelectric conversion of incident light; and
a charge transfer unit of an n-channel insulating gate type configured to transfer a signal charge photoelectrically converted in the light-receiving unit;
wherein
said charge transfer unit has an insulating film formed on a transfer electrode,
said insulating film has a negative fixed charge, and
said insulating film forms a laminate film along with at least one other insulating film having a negative fixed charge, and said laminate film is formed to extend over said light-receiving unit and serves as an antireflective film on said light-receiving unit.

6. The solid-state image pickup device according to claim 1, wherein said insulating film is made of hafnium dioxide ($HfO_2$), dialuminium trioxide ($Al_2O_3$), ditantalum pentaoxide ($Ta_2O_5$), dilanthanum trioxide ($La_2O_3$), diyttrium trioxide ($Y_2O_3$), zirconium dioxide ($ZrO_2$), dipraseodymium trioxide ($Pr_2O_3$), dineodium trioxide ($Nd_2O_3$), dipromethium trioxide ($Pm_2O_3$), disamarium trioxide ($Sm_2O_3$), dieuropium trioxide ($Eu_2O_3$), digadolinium trioxide ($Gd_2O_3$), diterbium trioxide ($Tb_2O_3$), didysprosium trioxide ($Dy_2O_3$), diholmium trioxide ($Ho_2O_3$), dierbium trioxide ($Er_2O_3$), dithulium trioxide ($Tm_2O_3$), diytterbium trioxide ($Yb_2O_3$), dilutetium trioxide ($Lu_2O_3$) or titanium oxide ($TiO_2$).

7. A solid-state image pickup device which comprises:
a light-receiving unit for photoelectric conversion of incident light; and
a charge transfer unit of an n-channel insulating gate type configured to transfer a signal charge photoelectrically converted in the light-receiving unit,
wherein
said charge transfer unit has an insulating film formed on a transfer electrode,
said insulating film has a negative fixed charge, and
said insulating film contains nitrogen.

8. A solid-state image pickup device which comprises:
a light-receiving unit for photoelectric conversion of incident light; and
a charge transfer unit of an n-channel insulating gate type configured to transfer a signal charge photoelectrically converted in the light-receiving unit
wherein
said charge transfer unit has an insulating film formed on a transfer electrode,
said insulating film has a negative fixed charge, and
said insulating film contains silicon.

9. An image pickup apparatus comprising:
a focusing optical unit configured to focus an incident light;
a solid-state image pickup device configured to have a plurality of sensor units photoelectrically converting incident light and outputting the resulting electric signal, and a focusing lens for focusing said incident light and transmitting the focused light to the respective sensor units; and
a signal processor unit configured to process the signal photoelectrically converted in said solid-state image pickup device;
wherein said solid-state image pickup device includes
(a) a light-receiving unit for the photoelectric conversion of the incident light, and
(b) a charge transfer unit of an n-channel insulating gate type transferring a signal charge photoelectrically converted in said light-receiving unit, and
(c) an insulating film having a negative fixed charge, said insulating film being formed on a transfer electrode of said charge transfer unit, said insulating film being in contact between adjacent transfer electrodes with an insulating layer of a substrate.

10. A solid-state image pickup device which comprises:
light-receiving means for photoelectric conversion of incident light; and
charge transfer means of an n-channel insulating gate type for transferring a signal charge photoelectrically converted in the light-receiving means;
wherein
said charge transfer means has an insulating film formed on a transfer electrode,
said insulating film has a negative fixed charge, and
said insulating film is in contact between adjacent transfer electrodes with an insulating layer of a substrate.

11. The solid-state image pickup device of claim 1, wherein said insulating layer is a gate insulating layer that is formed between the transfer electrode and the substrate.

* * * * *